United States Patent
Prack et al.

(10) Patent No.: US 6,664,200 B1
(45) Date of Patent: Dec. 16, 2003

(54) METHOD OF MANUFACTURING A SEMICONDUCTOR COMPONENT AND POLYIMIDE ETCHANT THEREFOR

(76) Inventors: Edward R. Prack, 102 Indian Bend, Austin, TX (US) 78734; Frank W. Fischer, 660 W. Mendoza Ave., Mesa, AZ (US) 85210; Treliant Fang, 6324 W. Dublin La., Chandler, AZ (US) 85226

( * ) Notice: Subject to any disclaimer, the term of this patent is extended or adjusted under 35 U.S.C. 154(b) by 0 days.

(21) Appl. No.: 09/560,974

(22) Filed: Apr. 28, 2000

(51) Int. Cl.[7] .............................................. H01L 21/31
(52) U.S. Cl. .................. 438/780; 438/781; 148/DIG. 75
(58) Field of Search ................................. 438/763, 780, 438/781; 148/DIG. 75

(56) References Cited

U.S. PATENT DOCUMENTS 6,151,045 A * 11/2000 Beach et al. ................... 347/45

* cited by examiner

*Primary Examiner*—Trung Dang

(57) ABSTRACT

A method of manufacturing a semiconductor component having a layer (240, 340) comprised of polyimide includes using an etchant that is at least partially composed of aminopropanediol to etch the layer comprised of polyimide. The etchant can also include a solvent, a diluent, and water.

30 Claims, 2 Drawing Sheets

METHOD OF MANUFACTURING A SEMICONDUCTOR COMPONENT AND POLYIMIDE ETCHANT THEREFOR

FIELD OF THE INVENTION

This invention relates, in general, to semiconductor components, and more particularly, to methods of manufacturing semiconductor components and polyimide etchants therefor.

BACKGROUND OF THE INVENTION

Polyimide layers are less porous than traditional dielectric layers such as silicon nitride layers, silicon oxy-nitride layers, and silicon dioxide layers. Therefore, a polyimide layer is suitable as a final passivation layer over semiconductor devices forming an integrated circuit. Furthermore, polyimide layers are photo-definable while the traditional dielectric layers are not photo-definable. Therefore, the deposition and patterning of polyimide layers requires fewer processing steps than the deposition and patterning of the traditional dielectric layers, which require the formation of an additional etch mask layer.

However, after a polyimide layer is patterned and cured, it is very difficult to remove the polyimide layer. In fact, those skilled in the art consider a patterned polyimide layer to be a permanent or non-removable layer. Therefore, if there are defects in a patterned polyimide layer, the resulting semiconductor components must be scrapped or discarded because the polyimide layer cannot be reworked or salvaged. It is very costly to scrap the semiconductor components after forming the polyimide layer because the polyimide layer is formed near the end of the manufacturing process.

Accordingly, a need exists for a method of manufacturing a semiconductor component that uses a polyimide layer and a polyimide etchant therefor.

BRIEF DESCRIPTION OF THE DRAWINGS

The invention will be better understood from a reading of the following detailed description, taken in conjunction with the accompanying drawing figures in which.

Figure 1:
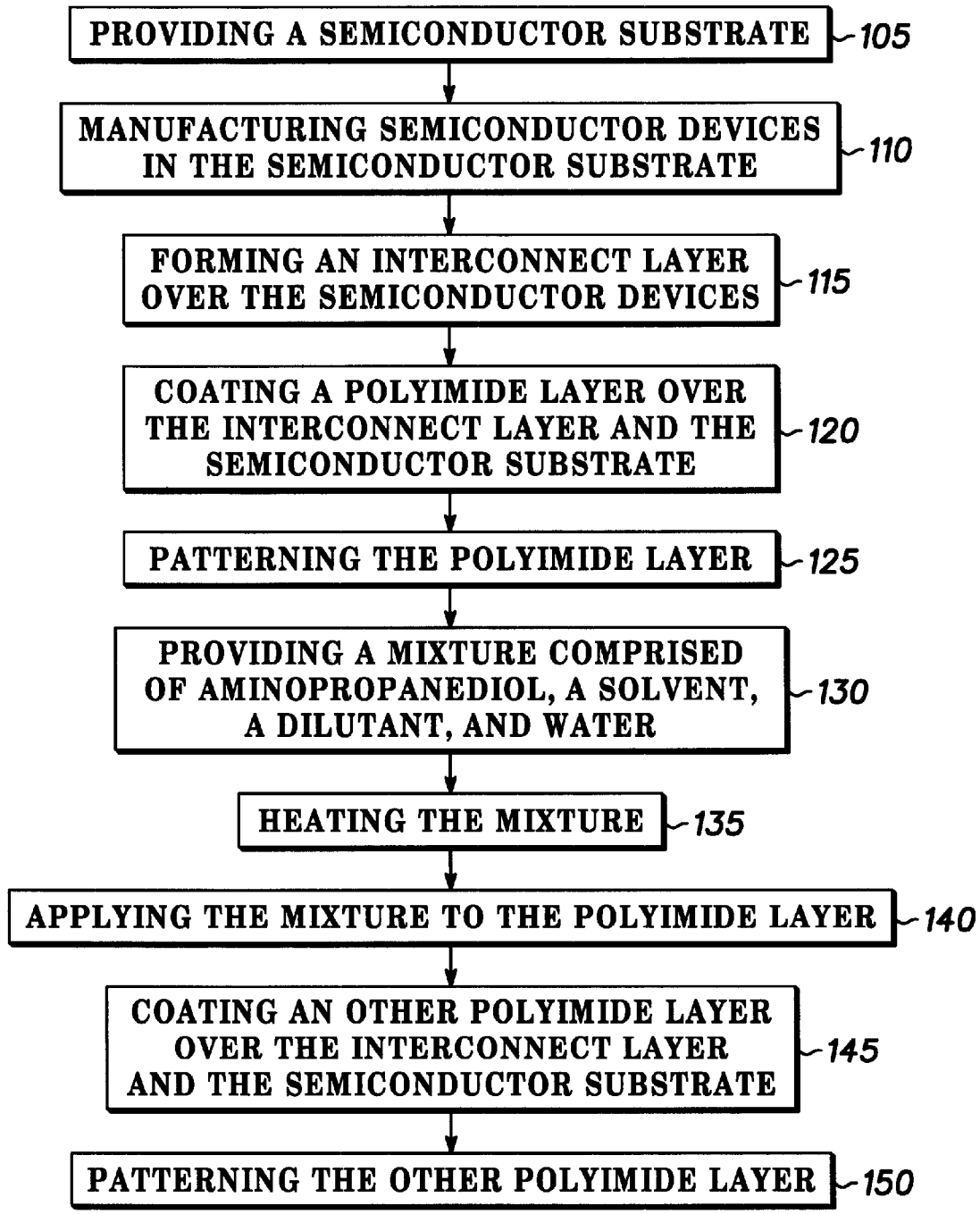
FIG. 1 illustrates a flow chart for a method of manufacturing a semiconductor component in accordance with a first embodiment of the invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the invention. Furthermore, the terms first, second, over, under, and the like in the description and in the claims, if any, are used for distinguishing between similar elements and are not necessarily used for describing a sequential or chronological order or for describing relative positions. It is understood that the terms so used are interchangeable under appropriate circumstances. It is further understood that the embodiments of the invention described herein are capable of operation in other sequences than described or illustrated herein.

DETAILED DESCRIPTION OF THE DRAWINGS

FIG. 1 illustrates a flow chart for a method 100 of manufacturing a semiconductor component. At a step 105 in method 100, a semiconductor substrate is provided. As an example, the semiconductor substrate can be comprised of a single crystal silicon support substrate underneath an epitaxial silicon layer. Next, at a step 110 in method 100, a plurality of semiconductor devices are manufactured in the semiconductor substrate. As an example, the semiconductor devices can include Metal-Oxide-Semiconductor Field Effect Transistors (MOSFETs) and bipolar transistors. Then, at a step 115 in method 100, an interconnect layer is formed over the semiconductor devices and the semiconductor substrate. The interconnect layer can be a single interconnect layer or be a multi-level interconnect structure. The interconnect layer electrically couples the semiconductor devices together to form a plurality of integrated circuits or semiconductor components.

At a step 120 in method 100, a first layer comprised of polyimide is coated over the semiconductor substrate, the semiconductor devices, and the interconnect layer. The first layer comprised of polyimide, the interconnect layer, and the semiconductor substrate form a composite substrate, which contains a plurality of semiconductor components. If the interconnect layer of step 115 is a single-layer interconnect structure, then the polyimide can serve as a passivation layer. However, if the interconnect layer of step 115 is a multi-layer interconnect structure, then the polyimide can serve as either a passivation layer or as an inter-layer dielectric separating adjacent interconnect layers.

Many different types of polyimide can be used during step 120 of method 100. However, the following polyimides are preferred: (1) polyimide S-200 commercially available from Hitachi Chemical Company America, Ltd., a wholly-owned subsidiary of Hitachi Chemical Company, Limited of Tokyo, Japan; (2) polyimide 5878 commercially available from E. I. Du Pont de Nemours & Company of Wilmington, Delaware; and (3) polyimide 2771, also commercially available from E. I. Du Pont de Nemours & Company.

Next, at a step 125 of method 100, the first layer comprised of polyimide is patterned. This patterning step includes exposing the polyimide to a pattern of actinic radiation or light, developing the polyimide into the pattern, and curing the polyimide. As an example, the first layer comprised of polyimide can have a thickness of approximately 3 to 8 micrometers after step 125.

Then, at a step 130 of method 100, a mixture comprised of aminopropanediol is provided. The mixture can optionally also include a solvent, a diluent, and water. The solvent can be provided or selected from a group of active solvents consisting of pyrrolidones and piperidones. Additional details of each component of the mixture are described hereinafter.

At a step 135 of method 100, the mixture is heated to a temperature above room temperature to increase the etch rate of the mixture. As an example, the mixture can be heated to approximately 130 to 160 degrees Celsius. Preferably, the mixture is not heated above approximately 160 degrees Celsius to prevent the mixture from anisotropically etching the semiconductor substrate. When heated above approximately 165 degrees Celsius, the aminopropanediol in the mixture may anisotropically etch crystalline silicon, polycrystalline silicon, and amorphous silicon. In the preferred embodiment, the mixture is heated to a temperature of approximately 145 to 155 degrees Celsius.

Next, at a step 140 of method 100, the heated mixture is applied to the composite substrate. In particular, the mixture is applied to the first layer comprised of polyimide to remove at least a portion of the first layer. In the preferred embodiment, the mixture is used to remove the entire first layer and remains at the heated temperature of step 135 during step 140. The removal or etch selectivities between the polyimide and dielectrics in the composite substrate and between the polyimide and metals in the composite substrate are very high to prevent the simultaneous removal of the structures, such as the interconnect layer, underlying the polyimide. In the preferred embodiment, step 140 is performed by submerging the entire composite substrate into a tank of the mixture for approximately 2 to 30 minutes. In an alternative embodiment, the mixture can be sprayed onto the composite substrate. The submerging process is preferred over the spraying process due to safety concerns over combustion of the mixture at the elevated temperatures. If the spraying process is used, the spraying is preferably done in an inert ambient such as nitrogen to reduce the probability of combustion. Regardless of whether the submerging or spraying process is used, the application of the mixture to the composite substrate is preferably performed at ambient pressure.

Then, at a step 145 of method 100, a second layer comprised of polyimide is coated over the interconnect layer, the semiconductor devices, and the semiconductor substrate, and at a step 150 of method 100, the second layer is patterned in a manner similar to that described earlier for step 125. If the second layer also contains defects, method 100 may continue by repeating steps 130, 135, 140, 145, and 150 until the composite substrate comprises an acceptable polyimide layer.

The mixture described in steps 130, 135, and 140 can consist entirely of aminopropanediol. However, a solution of 100 percent aminopropanediol is expensive and may be too viscous. Therefore, to reduce the cost and viscosity of the mixture, the mixture can be comprised of, for example, approximately 0.5 to 70 percent by weight of the aminopropanediol. In the preferred embodiment, the mixture comprises approximately 10 to 30 percent by weight of the aminopropanediol. Also in the preferred embodiment, the specific type of aminopropanediol used in steps 130, 135, and 140 is 1-amino-2,3-propanediol. A chemical diagram of this type of aminopropanediol is as follows:

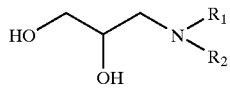

where $R_1$ can be $C_xH_{2X+1}$, where $R_2$ can be $C_yH_{2Y+1}$, and where X and Y are non-negative integers. As an example, X and Y can be different integers from 0 to 12. However, in the preferred embodiment, X and Y are preferably the same value and are each preferably equal to 0 to reduce the cost of the aminopropanediol. This preferred embodiment of aminopropanediol is commercially available from the Aldrich Chemical Company of Milwaukee, Wis.

The mixture can also optionally be comprised of a solvent. As an example, the mixture can comprise approximately 0 to 99.5 percent by weight of the solvent. The addition of the solvent to the mixture lowers the viscosity of the aminopropanediol and also increases the etch rate for the aminopropanediol. However, adding too much of the solvent reduces the etch rate of the mixture. In the preferred embodiment, the mixture comprises approximately 60 to 90 percent by weight of the solvent.

If the solvent is comprised of pyrrolidone, the pyrrolidone can have the following chemical diagram:

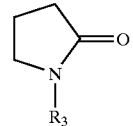

When $R_3$ is $C_vH_{2V+1}$, V is a positive integer, and the pyrrolidone is an N-alkyl pyrrolidone. As an example, V can be an integer from 1 to 10. In the preferred embodiment of N-alkyl pyrrolidone, V preferably equals 1 to reduce the cost of the pyrrolidone. In this preferred embodiment of N-alkyl pyrrolidone, the pyrrolidone is N-methyl pyrrolidone. However, when $R_3$ is $C_wH_{2W-1}$, W is a positive integer, and the pyrrolidone is a cyclic alkyl pyrrolidone. As an example, W can be an integer from 3 to 10. In the preferred embodiment of cyclic alkyl pyrrolidone, W equals 6 such that the pyrrolidone is N-cyclohexyl pyrrolidone. The N-cyclohexyl pyrrolidone is preferred because of its larger commercial availability compared to the other forms of cyclic alkyl pyrrolidone.

If the solvent is comprised of piperidone, the piperidone can have the following chemical diagram:

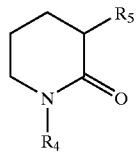

where $R_4$ can be $C_TH_{2T+1}$, where $R_5$ can be $C_UH_{2U+1}$, and where T and U are each positive integers. As an example, T and U can be different integers from 1 to 10. In the preferred embodiment of piperidone, T and U are preferably the same value and are each preferably equal to 1 to reduce the cost of the piperidone. In this preferred embodiment, the piperidone is dimethyl piperidone.

The mixture can further optionally be comprised of a diluent. As an example, the mixture can comprise approximately 1 to 30 percent by weight of the diluent. The diluent controls the concentration of the aminopropanediol to control the rate of precipitation in the aminopropanediol-polyimide mixture, to control the loading factor, and to lower the cost of the mixture. The diluent is less expensive than the solvent. As an example, the diluent can be comprised of an organic glycolether having a flash point greater than approximately 110 degrees Celsius. In the preferred embodiment, the diluent is comprised of tripropylene glycol methyl ether.

The mixture can also be optionally comprised of water. As an example, the mixture can comprise approximately 1 to 10 percent by weight of water. In the preferred embodiment, the combined percentage by weight of the diluent and the water is approximately 30 percent such that if the mixture comprises more water, then the mixture comprises less diluent, and if the mixture comprises more diluent, then the mixture comprises less water. The water is used to suppress the flash point of the aminopropanediol-containing mixture. In the preferred embodiment, the water is deionized water. In the embodiment of step 140 where the composite substrate is submerged into the mixture and where the mixture is comprised of water, the water is periodically added to the mixture due to evaporation of the water at the elevated temperatures.

Figure 2:
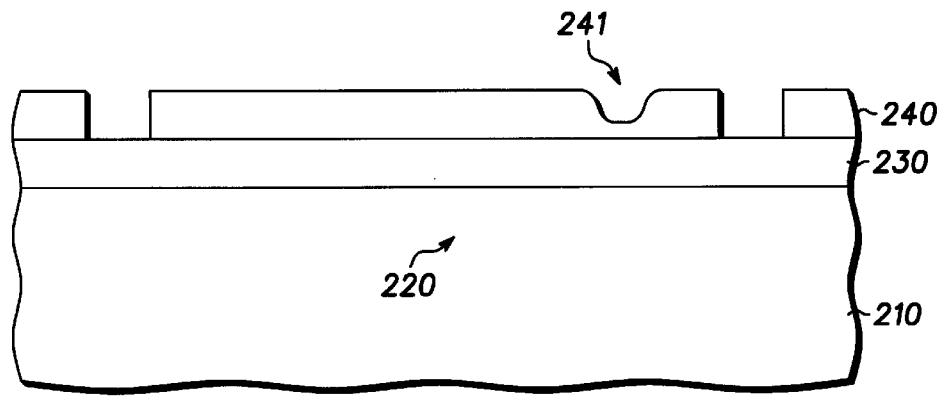
FIGS. 2 and 3 illustrate cross-sectional views of a composite substrate after different steps in the method of FIG. 1 in accordance with a first embodiment of the invention.

FIG. 2 illustrates a cross-sectional view of a composite substrate 200 after step 125 of method 100 in FIG. 1. In FIG. 2, substrate 200 comprises a semiconductor substrate 210, semiconductor devices 220, an interconnect layer 230, and a patterned polyimide layer 240 having a defect 241. Semiconductor devices 220 were manufactured in semiconductor substrate 210 during step 110 of FIG. 1, and interconnect layer 230 was formed over semiconductor devices 220 and semiconductor substrate 210 during step 115 of FIG. 1. Interconnect layer 230 is illustrated in a highly simplified view. Polyimide layer 240 is removed during step 140 of method 100 in FIG. 1.

Figure 3:
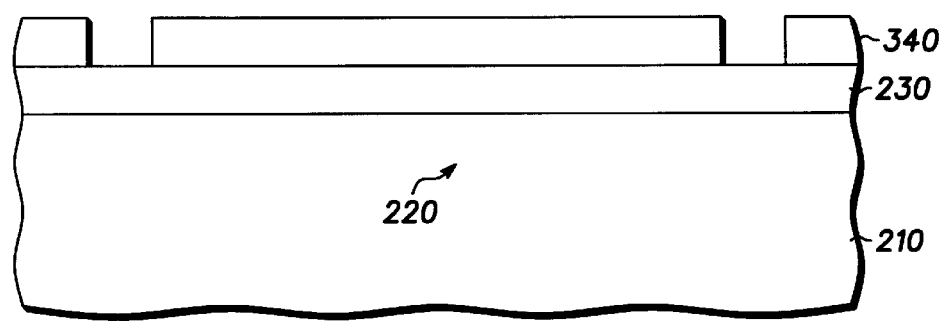

FIG. 3 illustrates a cross-sectional view of substrate 200 after step 150 in method 100 of FIG. 1. In FIG. 3, substrate 200 comprises a second polyimide layer 340 that does not have any defects. Polyimide layer 340 was coated over interconnect layer 230 during step 145 of FIG. 1 and was patterned during step 150 of FIG. 1.

Figure 4:
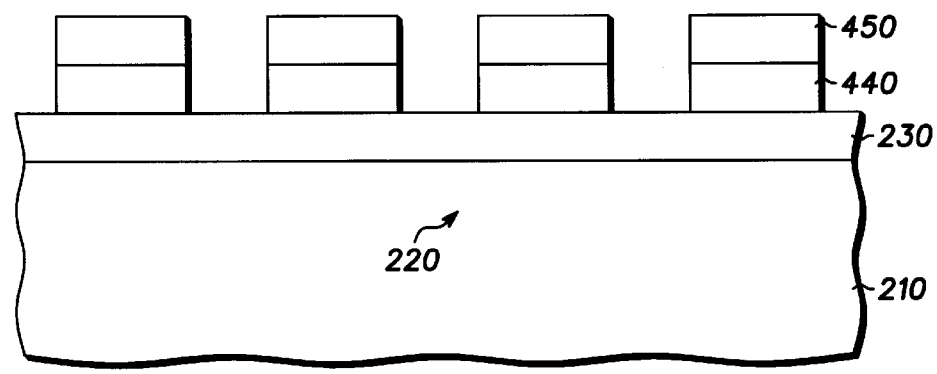
FIG. 4 illustrates a cross-sectional view of a second composite substrate after being etched by a polyimide etchant in accordance with a second embodiment of the invention.

FIG. 4 illustrates a cross-sectional view of a composite substrate 400 after being etched by an etchant mixture comprised of aminopropanediol. Substrate 400 comprises a patterned polyimide layer 440. Layer 440 is coated using a process similar to that described earlier in steps 120 and 145 of FIG. 1, but layer 440 was not patterned using the process described earlier in steps 125 and 150 of FIG. 1. Instead, all of layer 440 is exposed to actinic radiation or light, is developed, and is cured. At this point in the process, layer 440 does not have any holes and covers all of interconnect layer 230 and substrate 210.

Next, a mask layer 450 is formed over layer 440. Layer 450 is not comprised of photoresist because the etchant mixture comprised of aminopropanediol is not selective between photoresist and polyimide. Instead, layer 450 is preferably comprised of a material such as a metal or a dielectric. As an example, the metal can be aluminum copper, titanium or gold, and the dielectric can be silicon dioxide or silicon nitride. The mixture comprised of aminopropanediol has high etch selectivities between polyimide and metals and also between polyimide and dielectrics.

After layer 450 is deposited, layer 450 is patterned using an etchant and a separate patterned mask layer (not shown in FIG. 4), which can be comprised of photoresist. After patterning layer 450 and removing the separate patterned mask layer, layer 450 is used as an etch mask to define a pattern in layer 440 while the etchant mixture is used to etch the exposed portions of layer 440. As an example, the etchant mixture can be similar to the mixture described earlier in steps 130 and 135 in FIG. 1. Afterwards, mask layer 450 can be removed or can remain as part of composite substrate 400.

Therefore, an improved method of manufacturing a semiconductor component and polyimide etchant therefor is provided to overcome the disadvantages of the prior art. The semiconductor component includes a polyimide passivation layer and/or a polyimide inter-layer dielectric. The polyimide layer can be removed or reworked to improve the yield of the manufacturing process.

Although the invention has been described with reference to specific embodiments, it will be understood by those skilled in the art that various changes may be made without departing from the spirit or scope of the invention. For instance, the numerous details set forth herein such as, for example, the chemical concentrations and the temperatures are provided to facilitate the understanding of the invention and are not provided to limit the scope of the invention. Additionally, the mixture comprising aminopropanediol can further include additional solvents and/or other additives to alter the characteristics of the mixture. Furthermore, the polyimide layer can be coated and patterned over the semiconductor substrate before forming the interconnect layer. Moreover, step 140 of FIG. 1 can be performed before completing step 125. For example, the mixture can be applied to the polyimide layer after developing the polyimide layer, but before curing the polyimide layer. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:

providing a composite substrate comprised of a semiconductor substrate and a layer comprised of polyimide;

heating aminopropanediol; and applying the heated aminopropanediol to the layer comprised of polyimide.

2. The method of claim 1 further comprising:

manufacturing semiconductor devices in the semiconductor substrate; and forming an interconnect layer over the semiconductor substrate and the semiconductor devices.

3. The method of claim 1 wherein:

applying the aminopropanediol further comprises providing

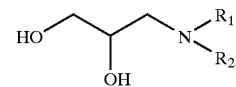

for the aminopropanediol;

$R_1$ is $C_XH_{2X+1}$;

$R_2$ is $C_YH_{2Y+1}$;

X is an integer from 0 to 12; and

Y is an integer from 0 to 12.

4. The method of claim 3 wherein:

X is 0; and

Y is 0.

5. The method of claim 1 wherein:

applying the aminopropanediol further comprises providing 1-amino-2,3-propanediol for the aminopropanediol.

6. The method of claim 1 wherein:

heating the aminopropanediol further comprises heating the aminopropanediol to approximately 130 to 160 degrees Celsius.

7. The method of claim 1 wherein:

heating the aminopropanediol further comprises heating the aminopropanediol to approximately 145 to 155 degrees Celsius.

8. The method of claim 1 wherein:

applying the aminopropanediol further comprises applying the aminopropanediol to the layer for approximately 2 to 30 minutes.

9. The method of claim 1 wherein:

applying the aminopropanediol further comprises applying a mixture comprised of approximately 0.5 to 70 percent by weight of the aminopropanediol to the layer.

10. The method of claim 1 wherein:
applying the aminopropanediol further comprises applying a mixture comprised of approximately 10 to 30 percent by weight of the aminopropanediol to the layer.

11. A method of manufacturing a semiconductor component comprising:
providing a composite substrate comprised of a semiconductor substrate and a layer comprised of polyimide; and
applying aminopropanediol to the layer comprised of polyimide, wherein:
applying the aminopropanediol further comprises applying a mixture comprised of a solvent and the aminopropanediol to the layer; and
applying the mixture further comprises providing the solvent from the group consisting of pyrrolidone and piperidone.

12. The method of claim 11 wherein:
applying the mixture further comprises providing the mixture comprised of approximately 60 to 90 percent by weight of the solvent.

13. The method of claim 11 wherein:
providing the solvent further comprises:
providing

[structure of pyrrolidone with $R_3$]

for the pyrrolidone; and
providing

[structure of piperidone with $R_5$ and $R_4$]

for the piperidone;
$R_3$ is selected from the group consisting of $C_V H_{2V+1}$ and $C_W H_{2W-1}$;
$R_4$ is $C_T H_{2T+1}$;
$R_5$ is $C_U H_{2U+1}$;
V is an integer from 1 to 10;
W is an integer from 3 to 10;
T is an integer from 1 to 10; and
U is an integer from 1 to 10.

14. The method of claim 13 wherein:
V is 1;
W is 6;
T is 1; and
U is 1.

15. The method of claim 11 wherein:
providing the solvent further comprises:
providing N-methyl pyrrolidone for the pyrrolidone; and
providing dimethyl piperidone for the piperidone.

16. The method of claim 11 wherein:
providing the solvent further comprises providing the pyrrolidone from the group consisting of N-cyclohexyl pyrrolidone and N-alkyl pyrrolidone.

17. The method of claim 11 wherein:
applying the mixture further comprises providing the mixture to be further comprised of a diluent.

18. The method of claim 17 wherein:
providing the mixture further comprises providing the mixture comprised of approximately 1 to 30 percent by weight of the diluent.

19. The method of claim 17 wherein:
providing the mixture further comprises providing an organic glycolether having a flash point greater than approximately 110 degrees Celsius for the diluent.

20. The method of claim 17 wherein:
providing the mixture further comprises providing tripropylene glycol methyl ether for the diluent.

21. The method of claim 17 wherein:
applying the mixture further comprises providing the mixture to be further comprised of water.

22. The method of claim 21 wherein:
applying the mixture further comprises providing the mixture to be comprised of approximately 1 to 10 percent by weight of the water.

23. The method of claim 1 wherein:
applying the aminopropanediol further comprises submerging the composite substrate into the aminopropanediol.

24. The method of claim 1 wherein:
applying the aminopropanediol further comprises spraying the aminopropanediol onto the layer.

25. The method of claim 1 further comprising:
forming a patterned layer over the layer comprised of polyimide, the patterned layer comprised of a material selected from the group consisting of a metal and a dielectric; and
using the patterned layer as an etch mask to define a pattern in the layer comprised of polyimide,
wherein:
applying the aminopropanediol further comprises applying the aminopropanediol after forming the patterned layer.

26. A method of manufacturing a semiconductor component comprising:
providing a semiconductor substrate;
manufacturing a plurality of semiconductor devices in the semiconductor substrate;
forming an interconnect layer over the semiconductor substrate and the plurality of semiconductor devices;
coating a first layer comprised of polyimide over the interconnect layer;
patterning the first layer;
providing a solvent from the group consisting of pyrrolidone and piperidone;
applying a mixture comprised of aminopropanediol, the solvent, a diluent, and water to the first layer to remove at least a portion of the first layer; and
coating a second layer comprised of polyimide over the interconnect layer after applying the mixture.

27. The method of claim 26 wherein:
applying the mixture further comprises:
providing 1-amino-2,3-propanediol for the aminopropanediol;

providing N-methyl pyrrolidone for the pyrrolidone;
providing dimethyl piperidone for the piperidone; and
providing tripropylene glycol methyl ether for the diluent.

28. The method of claim 26 wherein:

applying the mixture further comprises providing the mixture comprised of approximately 10 to 30 percent by weight of the aminopropanediol, approximately 60 to 90 percent by weight of the solvent, approximately 1 to 30 percent by weight of the diluent, and approximately 1 to 10 percent by weight of the water.

29. The method of claim 26 wherein:

applying the mixture further comprises applying the mixture to the first layer for approximately 2 to 30 minutes at approximately 145 to 155 degrees Celsius.

30. The method of claim 26 wherein:

applying the mixture further comprises submerging the semiconductor substrate and the first layer into the mixture.

\* \* \* \* \*

UNITED STATES PATENT AND TRADEMARK OFFICE
CERTIFICATE OF CORRECTION

PATENT NO. : 6,664,200 B1
DATED : December 16, 2003
INVENTOR(S) : Edward R. Prack, Frank W. Fischer and Treliant Fang It is certified that error appears in the above-identified patent and that said Letters Patent is hereby corrected as shown below:

<u>Title page,</u>
Item [76], Assignee, please add:

-- [73] Assignee: Motorola, Inc., Schaumburg, IL (US) --.

Signed and Sealed this

Twenty-seventh Day of July, 2004

JON W. DUDAS
*Acting Director of the United States Patent and Trademark Office*